(12) United States Patent
Gaither

(10) Patent No.: US 7,830,986 B1
(45) Date of Patent: Nov. 9, 2010

(54) METHOD AND APPARATUS FOR A PHASE/FREQUENCY LOCKED LOOP

(75) Inventor: Justin L. Gaither, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 1247 days.

(21) Appl. No.: 11/388,349

(22) Filed: Mar. 24, 2006

(51) Int. Cl.
*H04L 27/00* (2006.01)

(52) U.S. Cl. .................. 375/326; 327/147; 327/156; 342/103; 375/215; 375/294; 375/327; 375/376; 388/911; 455/260

(58) Field of Classification Search .............. 327/12; 331/11; 375/148, 376
See application file for complete search history.

(56) References Cited

U.S. PATENT DOCUMENTS

| | | | | |
|---|---|---|---|---|
| 4,291,274 A | * | 9/1981 | Suzuki et al. | 327/12 |
| 4,320,356 A | * | 3/1982 | Perdue | 331/11 |
| 5,373,255 A | * | 12/1994 | Bray et al. | 331/1 A |
| 6,219,376 B1 | * | 4/2001 | Zhodzishsky et al. | 375/148 |
| 2002/0061087 A1 | * | 5/2002 | Williams | 375/376 |

OTHER PUBLICATIONS

Justin L. Gaither; "A New Programmable Low Noise All Digital Phase-Locked Loop Architecture"; A thesis submitted to Iowa State University; Copyright Justin L. Gaither, 2005; pp. 1-74.

* cited by examiner

*Primary Examiner*—David C Payne
*Assistant Examiner*—Adolf DSouza
(74) *Attorney, Agent, or Firm*—Michael T. Wallace; John J. King

(57) ABSTRACT

A phase/frequency detector module allows operation as either a phase locked loop or a frequency locked loop. As a phased locked loop (PLL), the phase detector module is configured to decode phase differences between a reference signal and a voltage controlled oscillator (VCO) signal into phase correction signals that are updated at the rate of the VCO signal. An accumulation of the phase correction signals is implemented to form an accumulated phase error signal, which is then sampled at a lower rate than the VCO signal to accommodate slower components of the PLL, such as a digital to analog converter (DAC). As a frequency locked loop (FLL), the phase detector module is configured with frequency counters, so that frequency error may instead be detected. Any reduction of gain caused by the frequency counters is inherently equalized by the phase detector module.

20 Claims, 6 Drawing Sheets

METHOD AND APPARATUS FOR A PHASE/FREQUENCY LOCKED LOOP

FIELD OF THE INVENTION

The present invention generally relates to phase/frequency locked loops, and more particularly to phase/frequency detection used in phase/frequency locked loops.

BACKGROUND

Communication developments in the last decade have demonstrated what seems to be a migration from parallel data input/output (I/O) interface implementations to a preference for serial data I/O interfaces. Some of the motivations for preferring serial I/O over parallel I/O include reduced system costs through reduction in pin count, simplified system designs, and scalability to meet the ever increasing bandwidth requirements of today's communication needs. Serial I/O solutions will most probably be deployed in nearly every electronic product imaginable, including IC-to-IC interfacing, backplane connectivity, and box-to-box communications.

Although the need for increased communication bandwidth continues to drive future designs, support for the lower bandwidth legacy systems still remains. As such, the future designs are required to provide a wide range of scalability, whereby data rate, slew rate, and many other physical (PHY) layer attributes are adaptable. For example, a particular transmitter/receiver (TX/RX) pair may be configured for use as both a high-definition serial digital interface (HD-SDI) and a standard-definition serial digital interface (SD-SDI). Both standards have similar specifications, but differ from each other at the PHY layer with respect to, for example, bit rate and edge rate. In order to provide a cost effective solution for both interfaces, the same transmitter/receiver pair may be required to adapt to both specifications by changing its mode of operation.

The bit rate, for example, of the PHY layer may determine the particular mode of operation that is implemented by each transceiver. A lower bit rate, for example, of the PHY layer may dictate that an over-sampling of the input data stream may be employed, whereby the recovered clock signal is digitally reconstructed from a local clock reference. Conversely, a faster bit rate of the PHY layer may preclude the use of over-sampling, such that a clock and data recovery (CDR) circuit is used instead to generate the recovered clock signal from data transitions that are detected in the input data stream.

The recovered clock signal, however, may exhibit certain detrimental characteristics depending upon the mode in which it is generated. For example, the over-sampled version of the recovered clock signal may contain an excessive amount of spurious frequency content, which may preclude its use with conventional clean-up phase locked loops (PLLs), thus requiring a more robust phase/frequency detector. Alternatively, the CDR recovered clock signal may exhibit reduced spurious frequency content, thus allowing the use of a less robust phase/frequency detector. Efforts continue, therefore, to provide flexible designs that offer efficient functionality over a broad range of applications.

SUMMARY

To overcome limitations in the prior art, and to overcome other limitations that will become apparent upon reading and understanding the present specification, various embodiments of the present invention disclose an apparatus and method for a phase/frequency locked loop.

In accordance with one embodiment of the invention, a phase locked loop (PLL) comprises a phase detector that is coupled to receive first and second signals and is adapted to provide an error signal indicative of a phase error between the first and second signals. The phase detector includes an accumulator that is adapted to accumulate an incremental phase error between the first and second signals, the incremental phase error being accumulated synchronously with the second signal. The PLL further comprises a loop filter that is coupled to receive the error signal and is adapted to provide a control signal in response to the error signal. The PLL further comprises an oscillator that is coupled to receive the control signal and is adapted to adjust a phase of the second signal to be substantially equal to a phase of the first signal in response to the control signal.

In accordance with another embodiment of the invention, a frequency locked loop (FLL) comprises a frequency detector that is coupled to receive first and second signals and is adapted to provide an error signal indicative of a frequency error between the first and second signals. The frequency detector includes at least one counter module that is coupled to receive the first and second signals and is adapted to generate first and second count signals, the first and second count signals being indicative of a frequency of the first signal and a frequency of the second signal, respectively. The FLL further comprising a loop filter that is coupled to receive the error signal and is adapted to provide a control signal in response to the error signal. The FLL further comprising an oscillator that is coupled to receive the control signal and is adapted to adjust a frequency of the second signal to be substantially equal to a frequency of the first signal in response to the control signal.

In accordance with another embodiment of the invention, an integrated circuit (IC) comprises a frequency detector that is coupled to receive first and second signals and is adapted to provide an error signal that is indicative of a frequency error between the first and second signals. The frequency detector includes a counter that is coupled to receive the first and second signals and is adapted to generate first and second count signals, the first and second count signals being indicative of a frequency of the first signal and a frequency of the second signal. The IC further comprises a loop filter that is coupled to receive the error signal and is adapted to provide a control signal in response to the error signal. The IC receives the second signal externally in response to providing the control signal externally.

BRIEF DESCRIPTION OF THE DRAWINGS

Various aspects and advantages of the invention will become apparent upon review of the following detailed description and upon reference to the drawings in which.

DETAILED DESCRIPTION

Generally, the various embodiments of the present invention are applied to coherent serial communications that require recovery of the clock and data information received/transmitted by a transceiver of a serial communications device. In one embodiment, the data rate of the received serial data stream may be conducive to the over-sampling of the received data stream, such that clock and data recovery (CDR) may be derived digitally. In such an instance, a first mode of coherency may be achieved, whereby the receiver tracks the frequency of the received data stream. In an alternate embodiment, the data rate of the received serial data stream may preclude over-sampling, thus requiring the use of an alternate CDR mechanism. In this instance, a second mode of coherency is achieved, whereby the receiver is instead locked to the phase of the received data stream.

Thus, depending upon, for example, the data rate of the received data stream, the transceiver of the serial communications device may be configured in one of several modes for coherent communications. As such, reconfigurable logic devices, such as a programmable logic device (PLD), may be well suited for applications requiring the use of both modes. Alternatively, integrated circuits (ICs) or application specific integrated circuits (ASICs) may instead be used, given that the particular mode of operation is primarily static.

Figure 1:
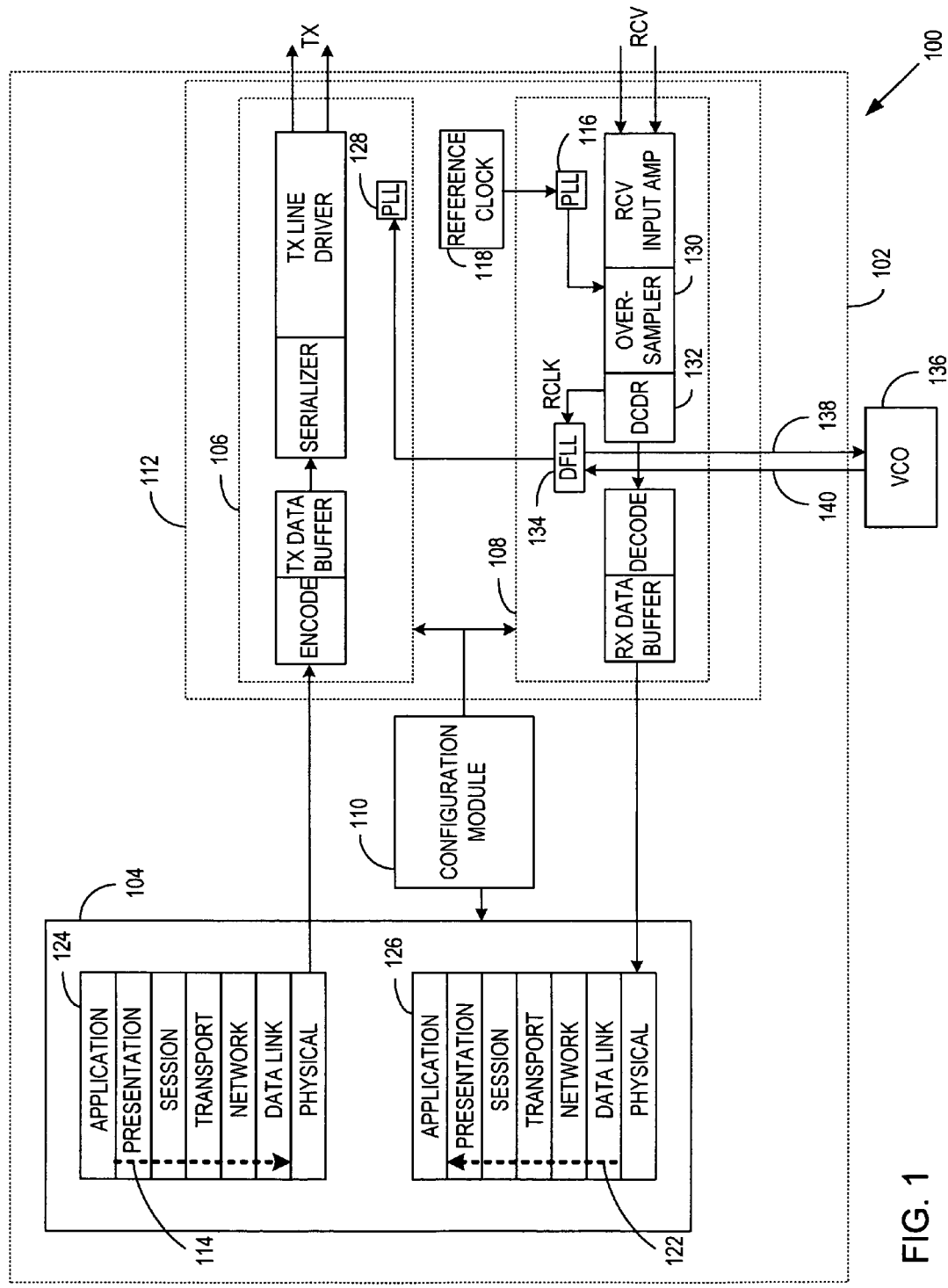
FIG. 1 illustrates an exemplary communication system.

Turning to FIG. 1, an exemplary block diagram 100 is illustrated in which integrated circuit (IC) 102 conducts serial communications with external communications equipment (not shown). In one embodiment, IC 102 may represent an FPGA, whereby configurable logic portion, i.e., fabric 104, and related processor supported functions are used to implement communication stacks 124 and 126 in support of the various communication protocols that may be supported by IC 102.

Using such an arrangement, data frames outbound from FPGA fabric 104 may propagate from, for example, the application layer to the physical layer of communication stack 124 via communication path 114. Similarly, data frames inbound to FPGA fabric 104 may propagate from, for example, the physical layer to the application layer of communication stack 126 via communication path 122.

Multi-gigabit transceiver (MGT) 112 implements the physical media attachment (PMA) and the physical coding sublayer (PCS) via transmitter 106 and receiver 108. Included with the PMA function, for example, are the deserializer functions associated with the digital receiver 108, and more particularly with digital CDR(DCDR) 132, the serializer functions of transmitter 106, the transmit line driver, and the receiver input amplifier.

Included with the PCS function, is the encoding/decoding function where, for example, 8B/10B or 64B/66B encoding/decoding is performed. The PCS function may also perform scrambling/descrambling functions and elastic buffering in support of channel bonding and clock correction. In support of the configuration and/or partial reconfiguration of FPGA fabric 104 and MGT 112 is configuration module 110, which may provide an on-board microprocessor, to further enable communication protocol support as well as maintenance functionality.

In particular with respect to MGT 112, a digital receiver implementation is exemplified, whereby over-sampler 130, DCDR 132, and digital frequency locked loop (DFLL) 134 are employed to provide frequency coherency with the received data stream, RCV. In operation, MGT 112 is configured to over-sample the input data stream, RCV, via over-sampler 130 for data rates at or below a threshold frequency, such as for example, 1.25 Gbps. Phase locked loop (PLL) 116 provides over-sampler 130 with a clock reference signal that is phase coherent with reference clock 118, which operates at a frequency adequate to provide the level of over-sampling that is required. It should be noted, that DFLL 134 and DCDR 132 may also be implemented within FPGA fabric 104, instead of being integrated within MGT 112 as shown.

Over-sampler 130 then generates multi-bit symbols for each data bit received in accordance with the level of over-sampling required. For example, given that the input data rate is 1.25 Gbps and the clock reference signal is operating at 10 GHz, then over-sampler 130 generates 8-bit symbols for each data bit received. In response, DCDR 132 generates a pulse width modulated clock signal, RCLK, whose edges are synchronous with reference clock 118, as opposed to being synchronous with the incoming data stream, RCV.

As such, DFLL 134 is employed to generate a reduced phase noise clock reference signal to PLL 128 that is frequency coherent with the data rate of the incoming data stream, RCV. In one embodiment, VCO 136 may exist externally to FPGA 102, where digital control signal 138 from DFLL 134 controls the phase/frequency of VCO clock signal 140 from VCO 136. PLL 128 then generates the high speed clock signal for the TX line driver, so that the outgoing data stream, TX, may be transmitted in frequency coherency with the input data stream, RCV.

Figure 2:
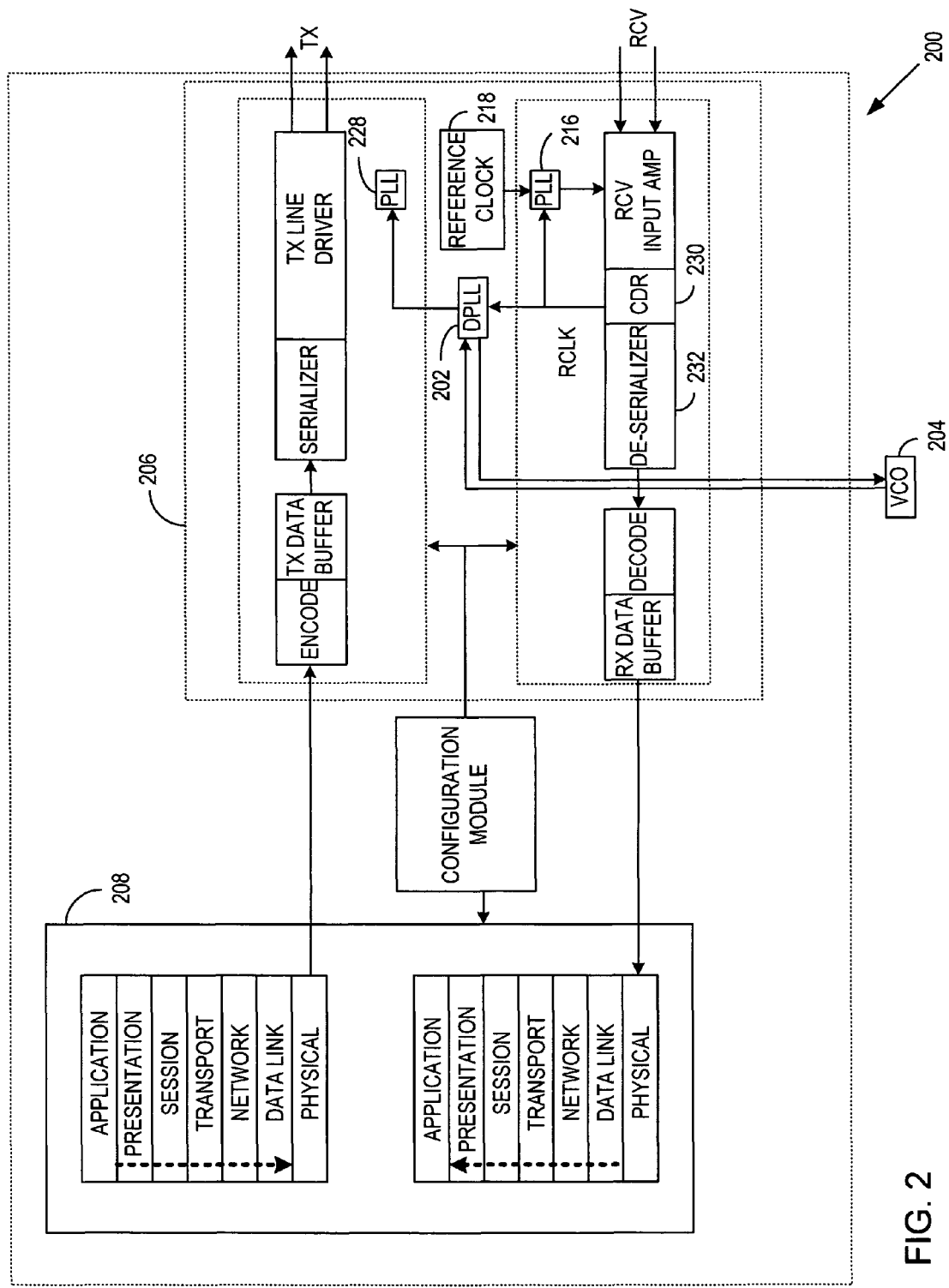
FIG. 2 illustrates an alternate communication system.

Turning to FIG. 2, an alternate receiver implementation is exemplified, whereby clock and data recovery (CDR) circuit 230 is instead utilized to provide reference clock signal, RCLK. In this instance, reference clock signal, RCLK, is keyed from the rising and falling edges of input data stream, RCV. Signal RCLK is then received by digital phase locked loop (DPLL) 202 as well as by PLL 216. DPLL 202 operates to maintain phase coherency between signal RCLK and VCO CLK 204 to provide PLL 228 with a reduced phase noise clock reference signal that is frequency coherent with signal RCLK. PLL 228 may then generate the high speed clock signal for the TX line driver, so that the outgoing data stream, TX, may be transmitted in frequency coherency with the input data stream, RCV. It should be noted, that DPLL 202 may also be implemented within FPGA fabric 208, instead of being integrated within MGT 206 as shown.

Figure 3:
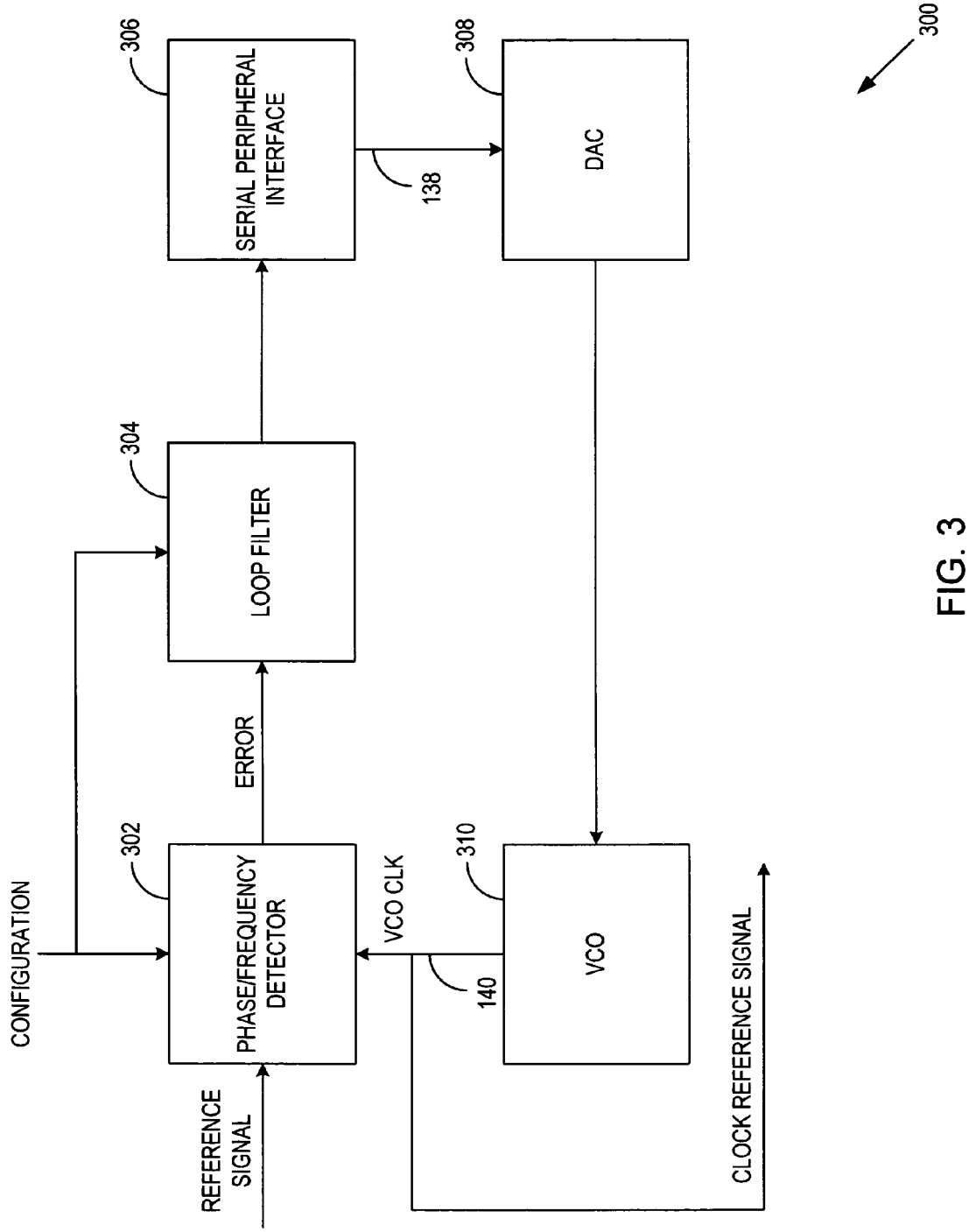
FIG. 3 illustrates an exemplary block diagram of the phase/frequency locked loop of FIGS. 1 and 2.

Turning to FIG. 3, an exemplary block diagram of phase/frequency locked loop 300 is illustrated. It is noted that reconfiguration of phase/frequency detector 302 may be performed depending upon the particular mode of operation that is required. If, for example, the digital receiver implementation of FIG. 1 is desired, then phase/frequency detector 302 may be configured by configuration module 110 via signal CONFIGURATION to implement a frequency detector as required by DFLL 134 of FIG. 1. Conversely, if the implementation of FIG. 2 is desired, then phase/frequency detector 302 may be configured by configuration module 110 via signal CONFIGURATION to implement a phase detector as required by PLLs 216 and/or 228 of FIG. 2.

In operation, phase/frequency detector 302 compares signals VCO CLK and REFERENCE SIGNAL and provides an indication via signal, ERROR, as to the amount of phase or frequency error existing between them. Phase/frequency detector 302 does not update signal ERROR during periods where REFERENCE SIGNAL is not experiencing data transitions, or is intermittent. Thus, phase/frequency detector 302 provides enhanced operation for use, for example, as a CDR phase detector. Additionally, phase/frequency detector 302 provides signal ERROR as a synchronous digital output signal that is readily integrated with a digital loop filter, such as that exemplified by loop filter 304.

As discussed in more detail below, digital loop filter 304 provides first and second order gain control paths, where the first order gain control path controls the response to small changes in phase/frequency, while the second order gain control path: maintains stability; responds to larger phase/frequency steps; and maintains the direct current (DC) offset as required by voltage controlled oscillator (VCO) 310.

Serial peripheral interface (SPI) 306 is a standard interface, which provides communication from loop filter 304 to DAC 308. For example, communications to DAC 308 may be implemented via a conventional 3-wire interface allowing increased flexibility in the selection of DAC 308 from various DAC models that are compatible with the conventional 3-wire interface. DAC 308, however, may represent a critical design path, since the speed of operation of DAC 308 may detrimentally impact loop performance. As discussed in more detail below, however, phase/frequency detector 302 provides an error accumulation feature, which compensates, among other detriments, for the potentially limiting speed of operation of DAC 308.

Figure 4:
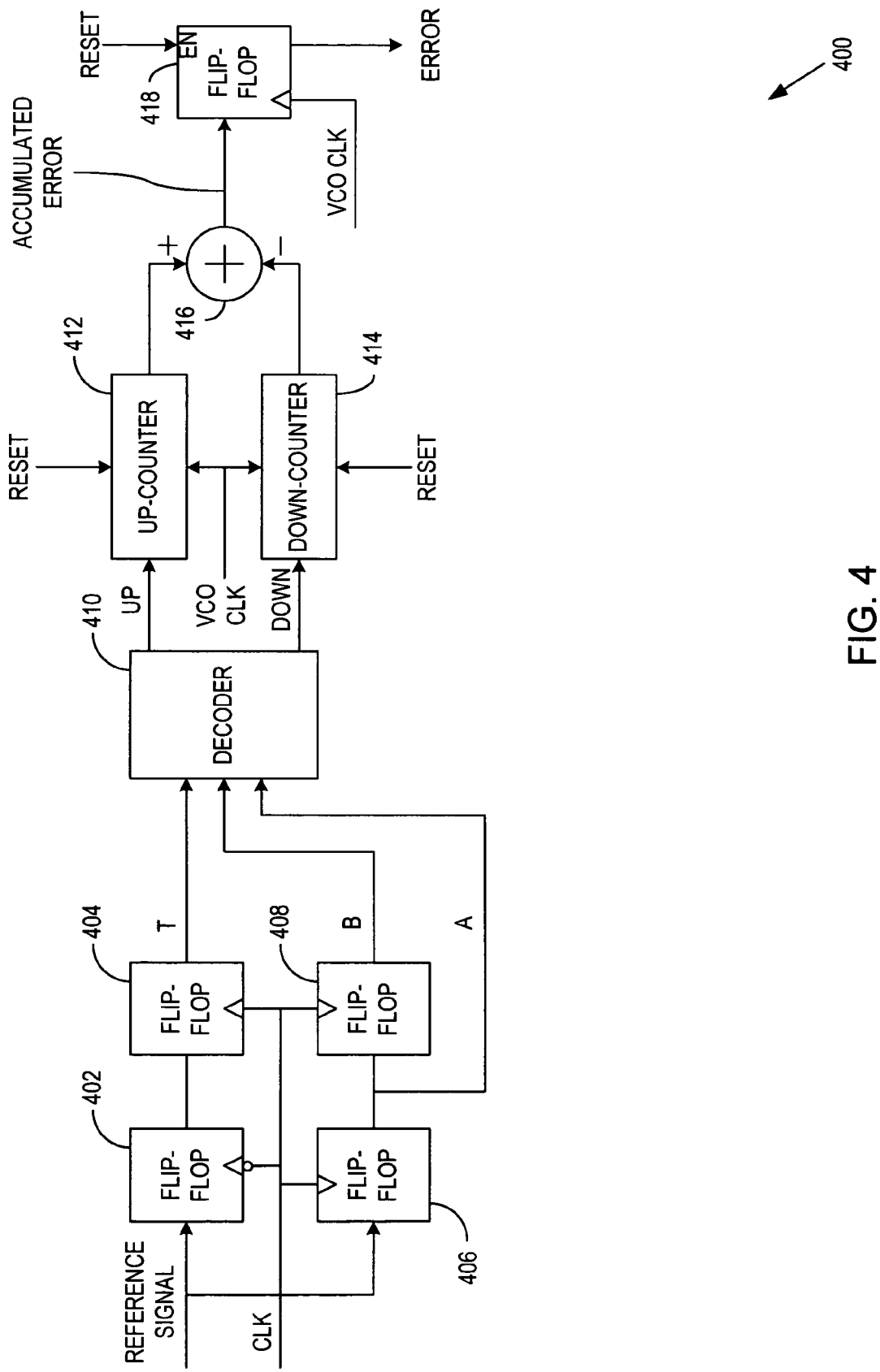
FIG. 4 illustrates an exemplary phase detector of the phase locked loop (PLL) of FIG. 3.

Turning to FIG. 4, an exemplary block diagram of a phase detector is illustrated, whereby signal CONFIGURATION of FIG. 3 may be used to reconfigure phase/frequency detector 302 to operate as phase detector 400. Such may be the case, for example, given that phase/frequency detector 302 is implemented on a programmable logic device (PLD) as illustrated, for example, in FIG. 2.

In operation, flip-flops 402 and 406 receive signal, REFERENCE SIGNAL, which in one embodiment, corresponds to signal RCLK of FIG. 2. Additionally, signal CLK may be generated from VCO 204, whose frequency may be adjusted in response to signal ACCUMULATED ERROR. Thus, by operation of phase detector 400, the phase/frequency of signal CLK may be adjusted, in response to signal ACCUMULATED ERROR, to be substantially equal to signal REFERENCE SIGNAL. It should be noted, that the frequency of signal REFERENCE SIGNAL should be at least ½ of the frequency of signal CLK, which in one embodiment, is provided by VCO 204.

Flip-flop 402 is synchronous with the inverted version of signal CLK, while flip-flops 404-408 are synchronous with the non-inverted version of signal CLK. Signal A is derived from the output of flip-flop 406, signal T is derived from the output of flip-flop 404, and signal B is derived from the output of flip-flop 408. Depending upon the relative phase difference between signals REFERENCE SIGNAL and CLK, determines the corresponding logic states of signals A, T, and B.

A tabulation of the available phase states between signals REFERENCE SIGNAL and CLK and the corresponding logic values of signals A, T, and B is illustrated in Table 1.

TABLE 1

| Signal A | Signal T | Signal B | Phase state | Response |
|---|---|---|---|---|
| 0 | 0 | 0 | No transition | No change |
| 0 | 0 | 1 | Early | Down |
| 0 | 1 | 0 | Invalid | No change |
| 0 | 1 | 1 | Late | Up |
| 1 | 0 | 0 | Late | Up |
| 1 | 0 | 1 | Invalid | No change |
| 1 | 1 | 0 | Early | Down |
| 1 | 1 | 1 | No transition | No change |

If signals A, T, and B indicate either an "Invalid" phase state or a "No transition" phase state, as denoted in Table 1, then decoder 410 determines that signals UP and DOWN are to remain unchanged. In this way, decoder 410 allows phase detector 400 to be useful in a CDR application, since the lack of transitions on signal REFERENCE SIGNAL, or conversely the entry into an invalid phase state between signals REFERENCE SIGNAL and CLK, results in no change of the reported phase state between signals REFERENCE SIGNAL and CLK.

If, on the other hand, the phase of signal REFERENCE SIGNAL is advanced with respect to the phase of signal CLK, then signals A, T, and B take on logic values of 1, 0, 0, or 0, 1, 1, respectively, to indicate a "Late" phase state. In such an instance, decoder 410 responds by asserting signal UP, such that the current count of UP-COUNTER 412 increases by 1 at the next transition of signal VCO CLK.

Conversely, given that the phase of signal REFERENCE SIGNAL is retarded with respect to the phase of signal CLK, then signals A, T, and B take on logic values 0, 0, 1, or 1, 1, 0, respectively, to indicate an "Early" phase state. In such an instance, decoder 410 responds by asserting signal DOWN, such that the current count of DOWN-COUNTER 414 increases by 1 at the next transition of signal VCO CLK. The difference between the current count of UP-COUNTER and DOWN-COUNTER is then taken by summer 416, the difference being represented by signal ACCUMULATED ERROR.

Decoder 410, up-counter 412, down-counter 414, and summer 416 continue to measure and accumulate the relative phase differences between signals REFERENCE SIGNAL and CLK by taking incremental phase measurements synchronously with signal VCO CLK as discussed above. After a predetermined period, signal RESET is asserted, which enables flip-flop 418 to sample the accumulated phase error, i.e., signal ACCUMULATED ERROR, between signals REFERENCE SIGNAL and CLK. The accumulated phase error is then sampled by flip-flop 418 and provided by signal, ERROR, at the next transition of signal VCO CLK.

It should be noted, therefore, that the rate of phase error accumulation, as accumulated by the accumulator comprising up-counter 412, down-counter 414, and summer 416, may proceed at a significantly higher rate than the sampling rate of the accumulated phase error. In such instances, signal RESET may be asserted at a lower rate than signal VCO CLK, which allows, for example, for loop filter 304, SPI 306, DAC 308, and VCO 310 to be operated at a much lower frequency than phase detector 400.

Figure 5:
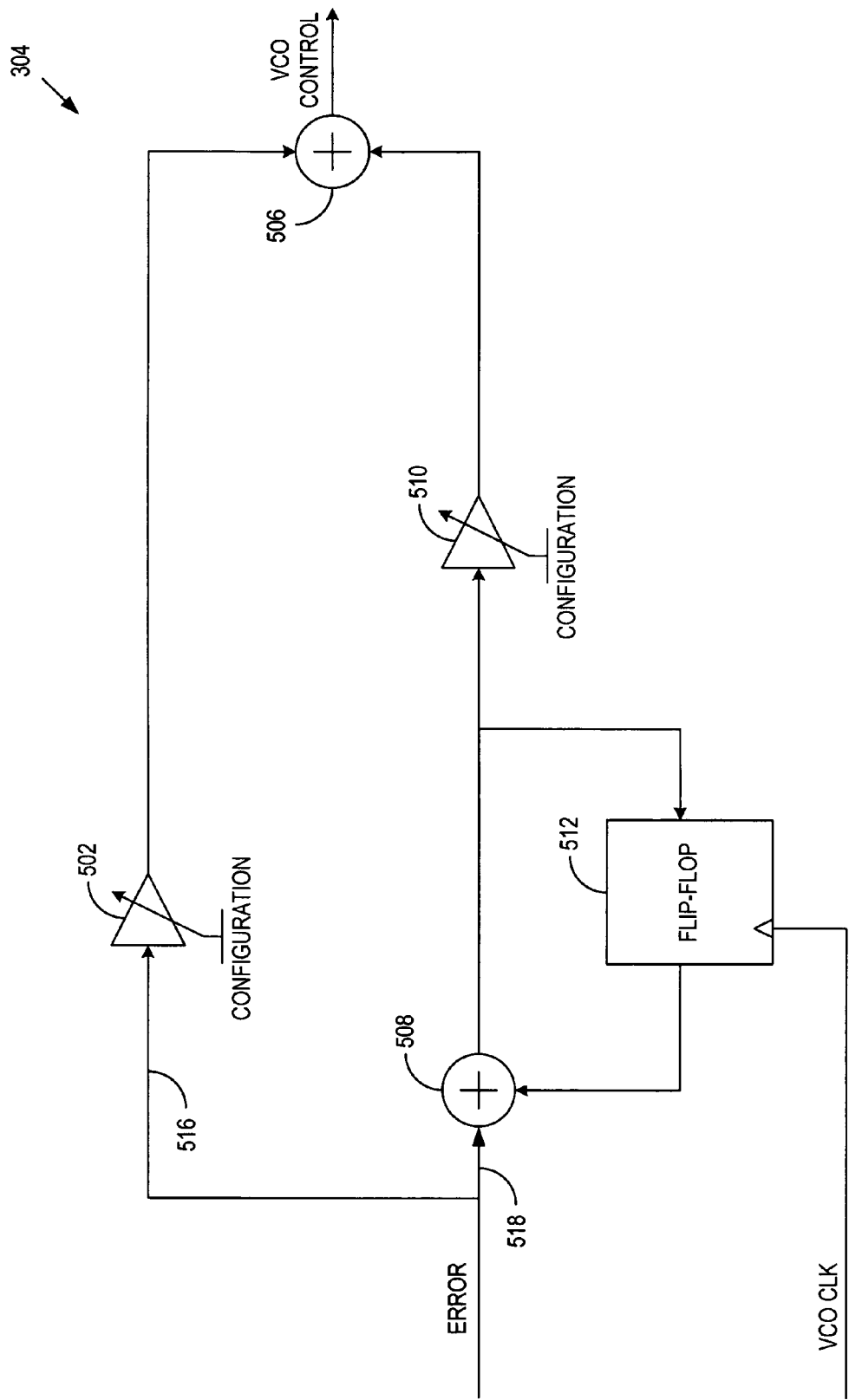
FIG. 5 illustrates an exemplary digital loop filter used in the phase/frequency locked loops of FIGS. 1 and/or 2.

Turning to FIG. 5, a schematic diagram of exemplary digital loop filter 304 is illustrated, whereby signal ERROR is received from phase detector 400 of FIG. 4. Signal ERROR is then propagated via first order path 516 and second order path 518 to summer 506, which ultimately provides the VCO control voltage, VCO CONTROL, that adjusts the phase/frequency of signal VCO CLK of FIGS. 3 and 4 as provided, for example, by VCO 310.

As discussed above, first order path 516 controls small changes in the phase/frequency of signal VCO CLK by providing small changes in VCO control voltage, VCO CONTROL. Gain stage 502 may be a programmable, digital gain stage, whereby the output of gain stage 502 represents a binary weighted version of its input. That is to say, for example, that the output of gain stage 502 may be described as in equation (1):

$$V_{OUT} = \frac{V_{IN}}{2^\beta}, \quad (1)$$

where β is a programmable integer value, $V_{OUT}$ is a signed integer, and $V_{IN}$ is a signed integer. In one embodiment, gain stage 502 may be implemented via a logical shift operator, whereby the value of $½^\beta$ is determined by an appropriate number of right shifts of gain stage 502. For example, given that the gain of gain stage 502 is desired to be ⅛, then β is programmed via signal CONFIGURATION to a value of 3, since ½³=⅛, thus requiring 3 shifts to the right.

Similarly, second order path 518 maintains the DC bias and tracks the slower, larger changes in the phase/frequency of signal VCO CLK via VCO control voltage, VCO CONTROL. Gain stage 510 also represents a programmable, digital gain stage, whereby the output of gain stage 510 represents a binary weighted version of its input. That is to say, for example, that the output of gain stage 510 may be described as in equation (2):

$$V_{OUT} = \frac{V_{IN}}{2^\alpha}, \quad (2)$$

where α is a programmable integer value, $V_{OUT}$ is a signed integer, and $V_{IN}$ is a signed integer. In one embodiment, gain stage 510 may be implemented via a logical shift operator, whereby the value of $½^\alpha$ is determined by an appropriate number of shifts to the right of gain stage 510. For example, given that the gain of gain stage 510 is desired to be 1/128, then α is programmed via signal CONFIGURATION to a value of 7, since ½⁷=1/128, thus requiring 7 shifts to the right. Generally speaking, β should be selected to be less than α−3 to insure loop stability. The programmability of α and β, via signal CONFIGURATION, further allows for greater pull-in and lock ranges of phase/frequency locked loop 300 of FIG. 3.

It can be seen, therefore, that by interconnecting phase detector 400 of FIG. 4 and loop filter 304 of FIG. 5 with SPI 306, DAC 308, and VCO 310, as is generally illustrated in FIG. 3, a digital phase locked loop may be implemented. Such a phase locked loop may be useful, for example, to implement DPLL 202 as illustrated in FIG. 2.

Figure 6:
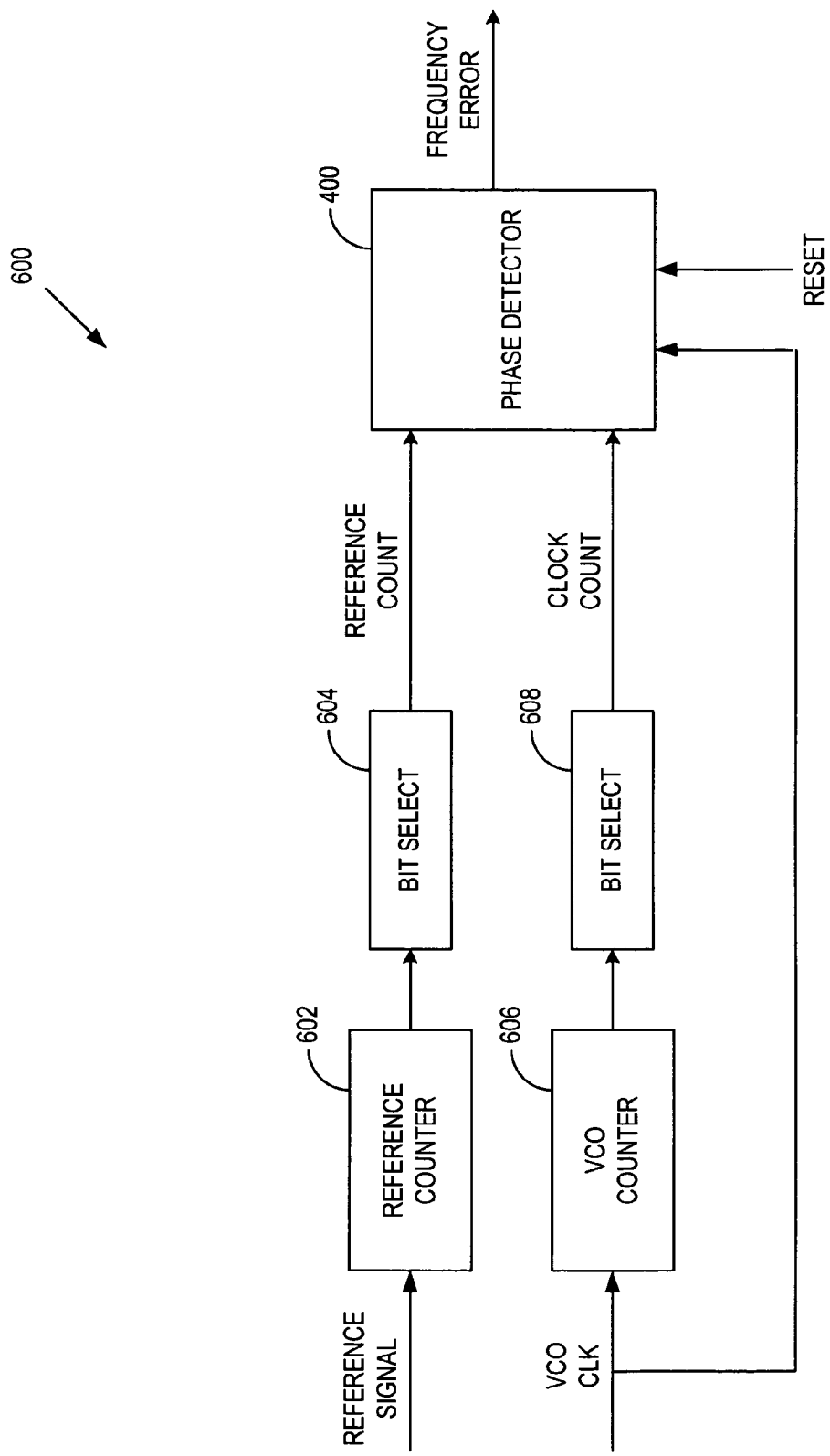
FIG. 6 illustrates an exemplary frequency detector of the frequency locked loop (FLL) of FIG. 3.

In an alternate embodiment, phase/frequency detector 302 of FIG. 3 may be reconfigured as frequency detector 600 as exemplified in FIG. 6 via signal CONFIGURATION. In such an instance, phase detector 400 of FIG. 4 may be augmented by the addition of reference counter 602 and VCO counter 606 and associated bit select blocks 604 and 608, respectively. Thus, by requiring that signals REFERENCE COUNT and CLOCK COUNT be aligned through operation of phase detector 400 of FIG. 4, frequency coherency is maintained between REFERENCE SIGNAL and VCO CLK, since signals REFERENCE COUNT and CLOCK COUNT are representative of the frequency of signals REFERENCE SIGNAL and VCO CLK. It should be noted that signal CLK of FIG. 4 equates to signal CLOCK COUNT of FIG. 6, when phase detector 400 is being utilized in the DFLL implementation of FIG. 1.

In operation, reference counter 602 and VCO counter 606 are initialized only once. Thereafter, their count values are allowed to continuously rollover each time their terminal count is reached. Thus, counters 602 and 606 act as if they exhibit infinitely long count values. For example, given that counters 602 and 606 are 8-bit counters, their terminal count value is 255, which rolls over to 0 once the terminal count of 255 is reached. Blocks 604 and 608 then select a particular bit from reference counter 602, REFERENCE COUNT, and a particular bit from VCO counter 606, CLOCK COUNT, for comparison by phase detector 400. As discussed in more detail below, the frequency of signals REFERENCE COUNT and CLOCK COUNT depends upon which bit of counters 602 and 606, respectively, is selected.

As discussed above, however, phase detector 400 seeks to maintain phase alignment between its input signals by accumulating the up and down counts as determined by Table 1, subtracting the down count from the up count, and then sampling the difference at sampling intervals that are specified by signal RESET. Thus, by providing signals REFERENCE COUNT and CLOCK COUNT that are indicative of a frequency of signal REFERENCE SIGNAL and a frequency of signal VCO CLK, respectively, phase detector 400 operates to maintain frequency coherency between signals REFERENCE SIGNAL and VCO CLK.

Bit select blocks 604 and 608 each select a single bit from counters 602 and 606, respectively. For example, given that bit 4 of an 8-bit counter is selected by counters 604 and 608, signals REFERENCE COUNT and CLOCK COUNT each toggle at a rate that is 1/16 of the rate of signals REFERENCE SIGNAL and VCO CLK. This relationship can be seen, since bit 4 of an 8-bit counter represents a digital count of $2^4=16$. Thus, for every 16 transitions of signals REFERENCE SIGNAL and VCO CLK, there is only 1 transition of signals REFERENCE COUNT and CLOCK COUNT, respectively.

Phase detector 400 reacts to phase differences between signals REFERENCE COUNT and CLOCK COUNT that are operating at, for example, 1/16 of the rate of signals REFERENCE SIGNAL and VCO CLK. Thus, the gain of frequency detector 600 is reduced by an amount that is proportional to the frequency division performed by bit select blocks 604 and 608.

However, returning to the discussion above pertaining to phase detector 400 of FIG. 4, it is understood that phase error accumulation is updated at the rate of signal VCO CLK. Thus, any reduction in gain that is caused by bit select blocks 604 and 608 is subsequently cancelled by the phase error accumulation rate of phase detector 400. In other words, even though the phase relationship between signals REFERENCE COUNT and CLOCK COUNT is being sampled at a reduced rate, the phase error accumulation of phase detector 400 is being updated at an accelerated rate through operation of signal VCO CLK. It can be seen, therefore, that any gain reductions caused by bit select blocks 604 and 608, through alternate selections of bits 0-8 of reference counters 602 and 606, may be similarly equalized by the accumulating phase error updates within phase detector 400.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A phase locked loop (PLL), comprising:
    a phase detector coupled to receive first and second signals and adapted to provide an error signal indicative of a phase error between the first and second signals, the phase detector having a decoder coupled to receive first, second and third phase indication signals derived from the first signal being sampled by at least a first phase of the second signal and a second phase of the second signal to provide an incremental phase error and an accumulator adapted to accumulate the incremental phase error between the first and second signals, the incremental phase error being accumulated synchronously with the second signal, wherein the error signal is based upon the accumulated phase error;

a loop filter coupled to receive the error signal and adapted to provide a control signal in response to the error signal; and an oscillator coupled to receive the control signal and adapted to adjust a phase of the second signal to be substantially equal to a phase of the first signal in response to the control signal.

2. The PLL of claim 1, wherein the phase detector further comprises:
a first flip-flop coupled to receive the first signal and adapted to sample the first signal in response to the first phase of the second signal; and
a second flip-flop coupled to receive the first signal and adapted to sample the first signal in response to the second phase of the second signal to provide the first phase indication signal.

3. The PLL of claim 2, wherein the phase detector further comprises:
a third flip-flop coupled to an output of the first flip-flop and adapted to provide the second phase indication signal; and
a fourth flip-flop coupled to an output of the second flip-flop and adapted to provide the third phase indication signal,
wherein the incremental phase error comprises first and second incremental phase error signals.

4. The PLL of claim 3, wherein the accumulator comprises:
a first counter coupled to receive the first incremental phase error signal and adapted to provide a first count synchronously with the second signal, the first count being indicative of an accumulated number of assertions of the first incremental phase error signal;
a second counter coupled to receive the second incremental phase error signal and adapted to provide a second count synchronously with the second signal, the second count being indicative of an accumulated number of assertions of the second incremental phase error signal; and
a summer coupled to receive the first and second counts and adapted to provide a difference between the first count and the second count.

5. The PLL of claim 4, wherein the phase detector further comprises a fifth flip-flop coupled to receive the difference and adapted to sample the difference in response to a reset signal to provide the error signal, the reset signal having a frequency lower than a frequency of the second signal.

6. The PLL of claim 1, wherein the loop filter comprises:
a first gain stage coupled to receive the error signal, the first gain stage adapted to divide the error signal by a first programmable integer to provide a first error signal;
a second gain stage coupled to receive the error signal, the second gain stage adapted to divide the error signal by a second programmable integer to provide a second error signal; and
a summer coupled to the first and second gain stages and adapted to sum the first and second error signals to provide the control signal.

7. The PLL of claim 6, further comprising a digital to analog converter (DAC) coupled between the loop filter and the oscillator and adapted to convert the control signal from a digital format to an analog format.

8. A frequency locked loop (FLL), comprising:
a frequency detector coupled to receive first and second signals and adapted to provide an error signal indicative of a frequency error between the first and second signals, the frequency detector having:
one or more counter modules coupled to receive the first and second signals and adapted to generate first and second count signals, the first and second count signals being indicative of a frequency of the first signal and a frequency of a second signal, respectively;
a first circuit coupled to receive the first count signal and adapted to generate a first frequency indicator signal;
a second circuit coupled to receive the second count signal and adapted to generate a second frequency indicator signal; and
a decoder coupled to receive first, second, and third phase indication signals derived from the first frequency indicator signal being sampled by at least a first phase of the second frequency indicator signal and a second phase of the second frequency indicator signal to provide an incremental phase error, wherein the error signal is based upon the incremental phase error;
a loop filter coupled to receive the error signal and adapted to provide a control signal in response to the error signal; and
an oscillator coupled to receive the control signal and adapted to adjust the frequency of the second signal to be substantially equal to the frequency of the first signal in response to the control signal.

9. The FLL of claim 8, wherein:
the first circuit comprises a first bit selector coupled to receive the first count signal and adapted to select one of a plurality of bits of the first count signal as the first frequency indicator signal; and
the second circuit comprises a second bit selector coupled to receive the second count signal and adapted to select one of a plurality of bits of the second count signal as the second frequency indicator signal.

10. The FLL of claim 9, wherein the frequency detector further comprises:
a first flip-flop coupled to receive the first frequency indicator signal and adapted to sample the first frequency indicator signal in response to the first phase of the second frequency indicator signal; and
a second flip-flop coupled to receive the first frequency indicator signal and adapted to sample the first frequency indicator signal in response to the second phase of the second frequency indicator signal to provide the first phase indication signal.

11. The FLL of claim 10, wherein the frequency detector further comprises:
a third flip-flop coupled to an output of the first flip-flop and adapted to provide the second phase indication signal; and
a fourth flip-flop coupled to an output of the second flip-flop and adapted to provide the third phase indication signal,
wherein the incremental phase error comprises first and second incremental phase error signals.

12. The FLL of claim 11, wherein the frequency detector further comprises:
a first counter coupled to receive the first incremental phase error signal and adapted to provide a first error count synchronously with the second signal, the first error count being indicative of an accumulated number of assertions of the first incremental phase error signal;
a second counter coupled to receive the second incremental phase error signal and adapted to provide a second error count synchronously with the second signal, the second error count being indicative of an accumulated number of assertions of the second incremental phase error signal; and a summer coupled to receive the first and second error counts and adapted to provide a difference between the first error count and the second error count.

13. The FLL of claim 12, wherein the frequency detector further comprises a fifth flip-flop coupled to receive the difference and adapted to sample the difference in response to a reset signal to provide the error signal, the reset signal having a frequency lower than a frequency of the second signal.

14. The FLL of claim 8, wherein the loop filter comprises:
a first gain stage coupled to receive the error signal, the first gain stage adapted to divide the error signal by a first programmable integer to provide a first error signal;
a second gain stage coupled to receive the error signal, the second gain stage adapted to divide the error signal by a second programmable integer to provide a second error signal; and
a summer coupled to the first and second gain stages and adapted to sum the first and second error signals to provide the control signal.

15. The FLL of claim 14, further comprising a digital to analog converter (DAC) coupled between the loop filter and the oscillator and adapted to convert the control signal from a digital format to an analog format.

16. An integrated circuit (IC), comprising:
a frequency detector coupled to receive first and second signals and adapted to provide an error signal indicative of a frequency error between the first and second signals, the frequency detector comprising:
a counter coupled to receive the first and second signals and adapted to generate first and second count signals, the first and second count signals being indicative of a frequency of the first signal and a frequency of the second signal;
a first bit selector coupled to receive the first count signal and adapted to select one of a plurality of bits of the first count signal as a first frequency indicator signal;
a second bit selector coupled to receive the second count signal and adapted to select one of a plurality of bits of the second count signal as a second frequency indicator signal; and
a decoder coupled to receive first, second, and third phase indication signals associated with the first frequency indicator signal and the second frequency indicator signal and adapted to provide first and second incremental phase error signals, wherein the error signal is based upon the first and second incremental phase error signals; and a loop filter coupled to receive the error signal and adapted to provide a control signal in response to the error signal, wherein the IC receives the second signal externally in response to providing the control signal externally.

17. The IC of claim 16, wherein the frequency detector further comprises:
a first flip-flop coupled to receive the first frequency indicator signal and adapted to sample the first frequency indicator signal in response to a first phase of the second frequency indicator signal; and
a second flip-flop coupled to receive the first frequency indicator signal and adapted to sample the first frequency indicator signal in response to a second phase of the second frequency indicator signal to provide the first phase indication signal.

18. The IC of claim 17, wherein the frequency detector further comprises:
a third flip-flop coupled to an output of the first flip-flop and adapted to provide the second phase indication signal; and
a fourth flip-flop coupled to an output of the second flip-flop and adapted to provide the third phase indication signal.

19. The IC of claim 18, wherein the frequency detector further comprises:
a first counter coupled to receive the first incremental phase error signal and adapted to provide a first error count synchronously with the second signal, the first error count being indicative of an accumulated number of assertions of the first incremental phase error signal;
a second counter coupled to receive the second incremental phase error signal and adapted to provide a second error count synchronously with the second signal, the second error count being indicative of an accumulated number of assertions of the second incremental phase error signal; and
a summer coupled to receive the first and second error counts and adapted to provide a difference between the first error count and the second error count.

20. The IC of claim 19, wherein the frequency detector further comprises a fifth flip-flop coupled to receive the difference and adapted to sample the difference in response to a reset signal to provide the error signal, the reset signal having a frequency lower than the frequency of the second signal.

* * * * *